United States Patent [19]
Goldberg et al.

[11] Patent Number: 4,856,179
[45] Date of Patent: Aug. 15, 1989

[54] METHOD OF MAKING AN ELECTRICAL DEVICE MADE OF PARTIALLY PYROLYZED POLYMER

[75] Inventors: Harris A. Goldberg, Colonia; Ilmar L. Kalnin, Millington; Clyde C. Williams, Roselle, all of N.J.; Spain, Ian L., Fort Collins, Colo.

[73] Assignee: Hoechst Celanese Corp., Somerville, N.J.

[21] Appl. No.: 141,077

[22] Filed: Jan. 5, 1988

Related U.S. Application Data

[60] Continuation of Ser. No. 859,709, May 5, 1986, abandoned, which is a division of Ser. No. 487,401, Apr. 21, 1983, Pat. No. 4,642,644.

[51] Int. Cl.$^4$ .................. D01F 9/14; H01H 61/02
[52] U.S. Cl. .................... 29/592.1; 29/622; 264/22; 264/27; 264/29.2; 264/83
[58] Field of Search .................. 264/29.2, 29.6, 104, 264/105, 272.16, 22, 27, 83; 423/447.1, 447.6, 112, 113; 357/1.2; 338/208; 324/451; 313/341; 252/502, 510, 511; 338/20, 22 R, 225 D; 29/592 R, 612, 622

[56] References Cited

U.S. PATENT DOCUMENTS

| | | | |
|---|---|---|---|
| Re. 26,065 | 7/1966 | Marvel et al. | 528/208 |
| 223,898 | 1/1880 | Edison | 264/29.2 |
| 234,345 | 11/1880 | Swan | 264/29.2 |
| 485,616 | 11/1892 | Edison | 264/29.2 |
| 3,006,899 | 10/1961 | Hill, Jr. et al. | 264/210.8 |
| 3,063,966 | 11/1962 | Kwolék | 528/336 |
| 3,094,511 | 6/1963 | Hill, Jr. et al. | 528/208 |
| 3,109,836 | 11/1963 | Berry | 528/271 |
| 3,174,947 | 3/1965 | Marvel et al. | 528/208 |
| 3,225,011 | 12/1965 | Preston et al. | 528/314 |
| 3,232,910 | 2/1966 | Preston | 528/312 |
| 3,285,696 | 11/1966 | Tsunoda | 264/D19 |
| 3,399,252 | 8/1968 | Hough et al. | 264/29.2 |
| 3,406,126 | 10/1968 | Litant | 524/260 |
| 3,414,645 | 12/1968 | Morgan, Jr. | 264/210.8 |
| 3,497,318 | 2/1970 | Moss | 264/D17 |
| 3,509,108 | 4/1970 | Prince | 528/337 |
| 3,533,741 | 10/1970 | Higgins | 264/29.2 |
| 3,533,743 | 10/1970 | Prescott et al. | 264/D19 |

(List continued on next page.)

FOREIGN PATENT DOCUMENTS

| | | | |
|---|---|---|---|
| 0015729 | 9/1980 | European Pat. Off. | 264/29.2 |
| 1241937 | 8/1971 | United Kingdom . | |
| 1257481 | 12/1971 | United Kingdom . | |
| 1344374 | 1/1974 | United Kingdom . | |

OTHER PUBLICATIONS

Antonowicz et al., "Switching Phenomena in Amorphous Carbon", Carbon, 10, (1972), pp. 81-86.

Bordure et al., "Electric Field Induced Percolation", Journal of Non-Crystalline Solids, 50, (1982), pp. 389-395.

N. R. Lerner, "Electrical Conducivity and Electron-Spin Resonance in Oxidatively Stabilized Polyacrylonitrile Subjected to Elevated Temperatures", J. Appl. Phys., 52(11), Nov. 1981.

Bron et al., "On New Conducting Polymer-Pyrolyzed Kapton", Solid State Communications, vol. 35, p. 135, (Pergamon, 1980).

Gittleman et al., "Are Pyrolyzed Polyimides Conducting Polymers?", Journal of Electronic Materials, vol. 10, No. 2, (1981).

Antonowicz et al., "Switching Phenomena in Glassy Carbon", Carbon, 1973, vol. 14, pp. 1-5.

Primary Examiner—Jan H. Silbaugh
Assistant Examiner—Aubert C. Lorin
Attorney, Agent, or Firm—Burns, Doane, Swecker & Mathis

[57] ABSTRACT

An electrical device is made by partially pyrolyzing polymer material by heating the material to between 500° C. and 800° C. Electrodes are applied to the material at two different locations to define an electrically active element therebetween. The device exhibits negative resistance in a portion of its voltage current domain and function as bi-directional electrical switches.

9 Claims, 4 Drawing Sheets

U.S. PATENT DOCUMENTS

| | | | |
|---|---|---|---|
| 3,541,056 | 11/1970 | Pikl | 528/312 |
| 3,542,719 | 11/1970 | Pollack | 524/211 |
| 3,547,895 | 12/1970 | Vernoleken et al. | 528/314 |
| 3,551,389 | 12/1970 | Prince, Jr. | 528/186 |
| 3,558,571 | 1/1971 | Blume | 264/211 |
| 3,575,933 | 4/1971 | Hoegger et al. | 264/184 |
| 3,600,350 | 8/1971 | Kwolek | 528/207 |
| 3,607,059 | 9/1971 | Joo et al. | 264/D19 |
| 3,671,542 | 6/1972 | Kwolek | 264/210.5 |
| 3,673,035 | 6/1972 | Whitney | 156/155 |
| 3,673,143 | 6/1972 | Bair et al. | 524/211 |
| 3,699,085 | 10/1972 | Johnson et al. | 528/313 |
| 3,716,607 | 2/1973 | Otani | 264/29.6 |
| 3,748,299 | 7/1973 | Waroblak et al. | 524/138 |
| 3,753,957 | 8/1973 | Jones | 528/208 |
| 3,827,998 | 8/1974 | Morgan | 528/336 |
| 3,836,498 | 9/1974 | Gulrich, Jr. et al. | 528/336 |
| 3,988,426 | 10/1976 | Ogawa et al. | 264/29.2 |
| 4,025,494 | 5/1977 | Morgan | 528/312 |
| 4,069,297 | 1/1978 | Saito et al. | 423/447.6 |
| 4,237,108 | 12/1980 | Fukuhara et al. | 423/447.7 |
| 4,237,109 | 12/1980 | Hiramatsu et al. | 423/447.6 |
| 4,401,590 | 8/1983 | Yoshimura et al. | 264/29.6 |
| 4,473,372 | 9/1984 | Kudor et al. | 264/29.6 |

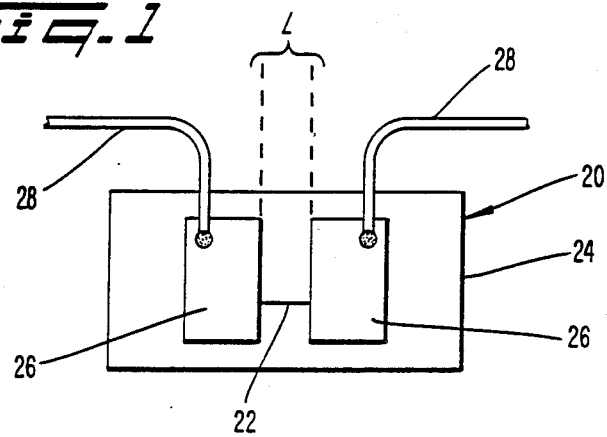
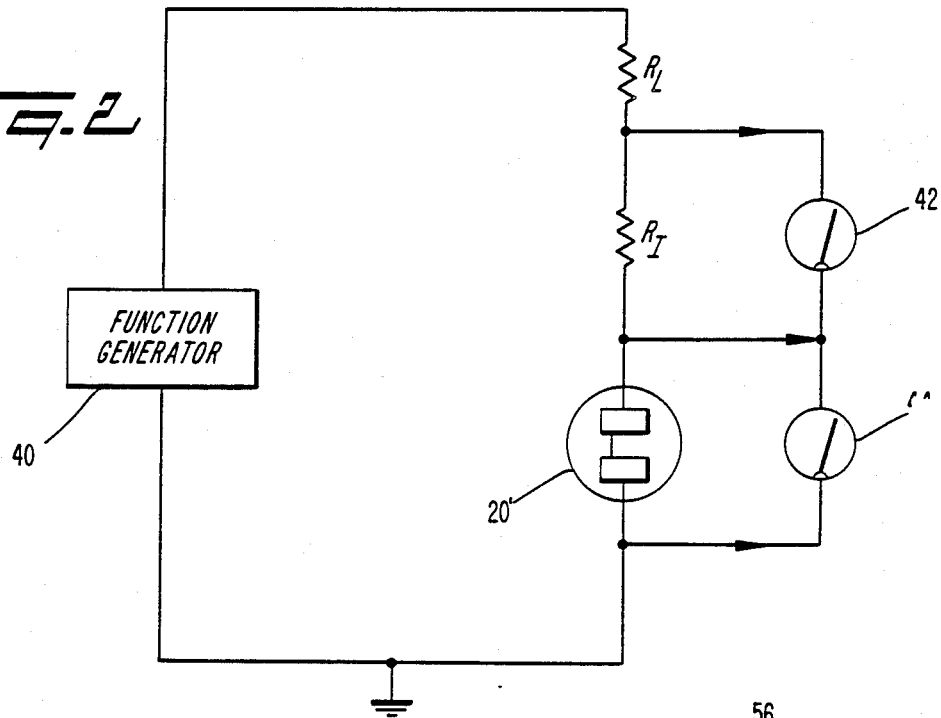
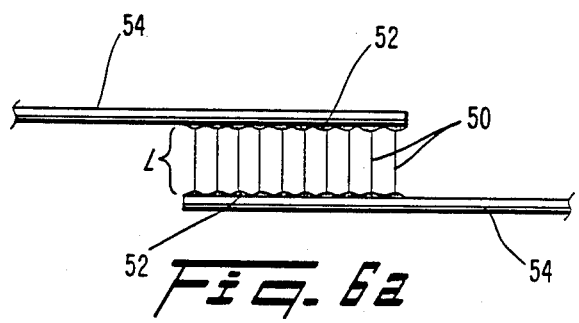
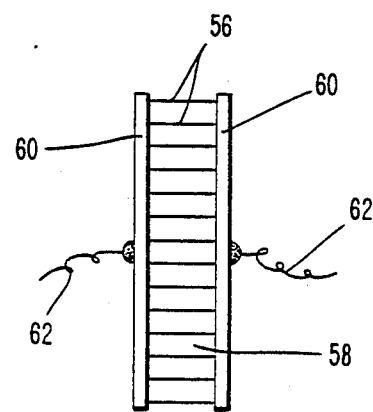

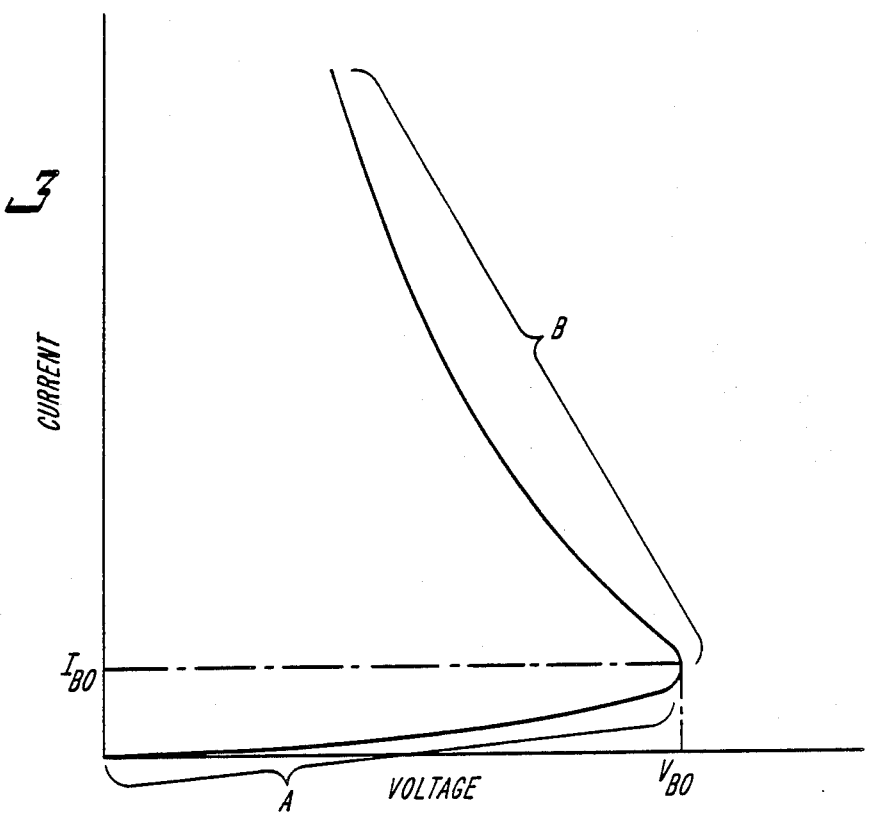
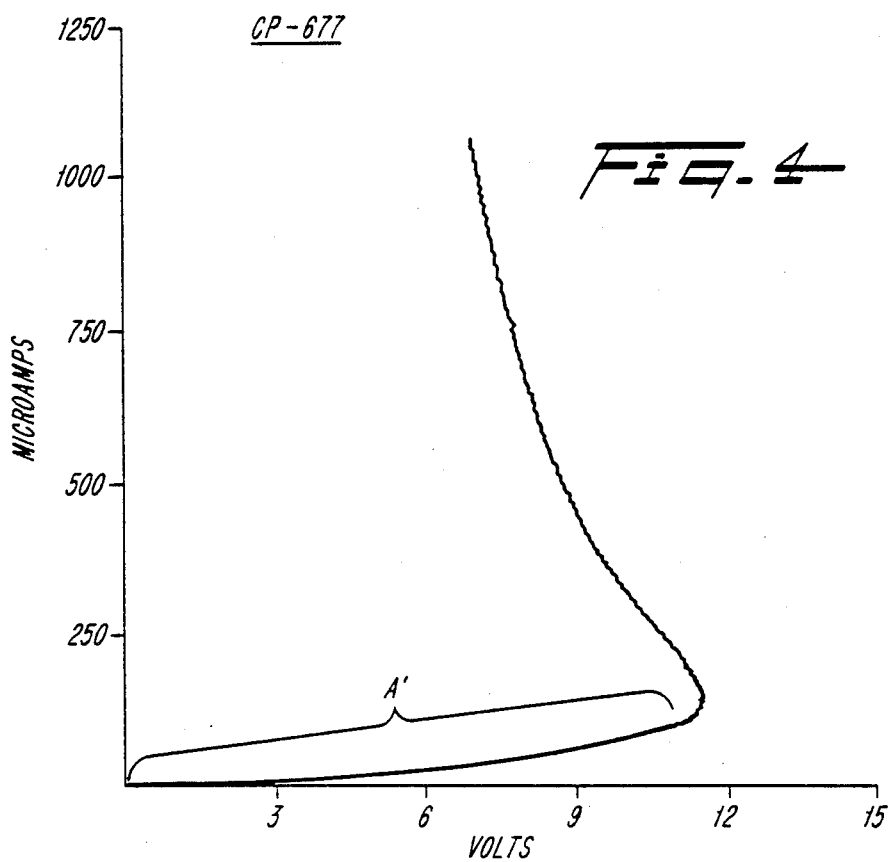

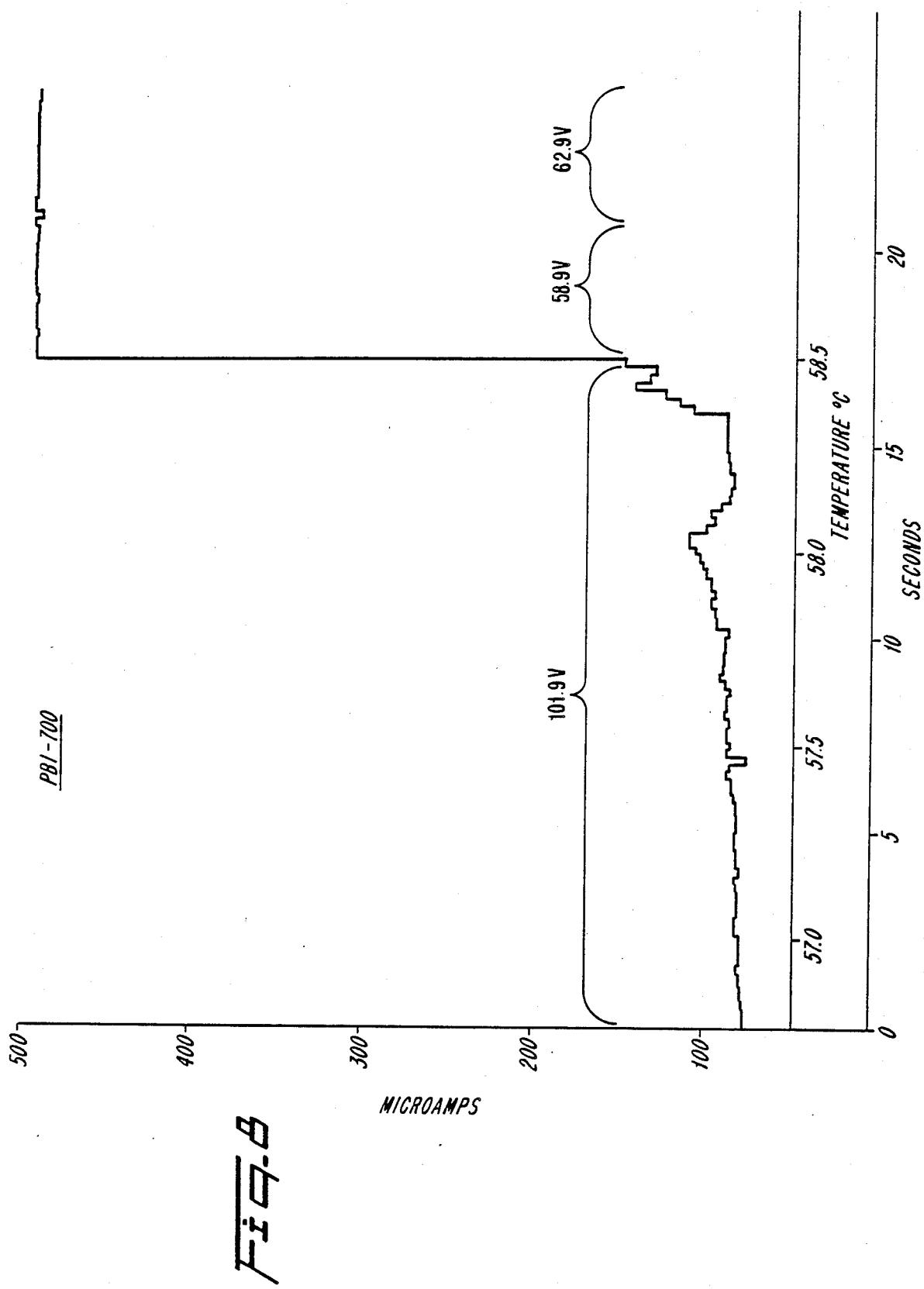

METHOD OF MAKING AN ELECTRICAL DEVICE MADE OF PARTIALLY PYROLYZED POLYMER

This application is a continuation of application Ser. No. 859,709, filed May 5, 1986, now abandoned, which is a divisional application of application ser. No. 487,401, filed Apr. 21, 1983, now U.S. Pat. No. 4,642,644.

BACKGROUND OF THE INVENTION

The present invention relates to electrical devices employing partially pyrolyzed polymer filaments and methods for making such devices.

Pyrolyzed carbonaceous fibers have been the subject of experimental investigation for a number of years.

It is know in the prior art to pyrolyze polymers at a range of temperatures. Several U.S. patents disclose pyrolyzation at temperatures as low as 500° C. in processes for improving the physical properties of the raw fiber, such as tenacity or Young's modulus. See U.S. Pat. Nos. 3,673,035 to Whitney and 4,069,297 to Saito and British Pat. Nos. 1,257,481 to Rolls-Royce and 1,344,374 to Sosedov et al. Other patents teach carbonization temperatures on the order of 700° C. See U.S. Pat. Nos. 3,285,696 to Tsunoda, 3,497,318 to Noss, 3,533,743 to Prescott, 3,607,059 to Joo, 3,988,426 to Ogawa et al, 4,237,108 to Fukuhara et al and 4,237,109 to Hiramatsu et al, and British Pat. No. 1,241,937 to Monsanto.

The conductive properties of carbon filaments have been exploited, for example, in making conductive moldable materials as discussed in U.S. Pat. No. 3,406,126 to Litant. It has also been proposed to employ low resistivity, pyrolyzed carbon fibers as light weight electrical conductors. Accordingly, changes in resistivity with pyrolyzation temperature have been the subject of experimentation.

The electrical conductivity of oxidized polyacrylonitrile (PAN) fiber has been studied as a function of heat treatment temperature between 710° K and 950° K. See N.R. Lerner, "Electrical Conductivity and Electron-Spin Resonance In Oxidatively Stabilized Polyacrylonitrile Subjected to Elevated Temperature", J. Appl. Phys. 52 (11), November 1981. The article indicates that resistivity measurements of pyrolyzed fiber were made after the resistance reading was constant for at least 1 minute. While Lerner reports variations in resistivity with pyrolyzation temperature, no non-ohmic effects are noted.

Brom et al. have studied the conductivity of pyrolyzed polyimide (Kapton) film as a function of pyrolysis temperature. Brom et al, "On New Conducting Polymer-Pyrolyzed Kapton", *Solid State Communications*, Vol. 35, p. 135 (Pergamon, 1980). Brom et al cut the pyrolyzed film into rectangular or needle shapes to measure the electronic properties of the material. At a controlled measurement temperature of 4.2° K, Brom et al. report that no deviation from ohmic behavior was seen up to voltage gradient of $2 \times 10^3$ v/cm.

Gittleman et al, postulate a structure for pyrolyzed polyimides in their article, "Are Pyrolyzed Polyimides Conducting Polmers?", *Journal of Electronic Materials*, Vol. 10, No. 2 (1981). Gittleman et al also suggest the application of higher fields to pyrolyzed polyimide film samples to test the validity of a theoretical "charging energy" model.

Electrical switching properties have been observed in evaporated carbon and glassy carbon coatings, heat treated to a maximum temperature of 600° C. See Antonowicz et al, "Switching Phenomena in Glassy Carbon," Carbon, 1973 Vol. 14, pp. 1–5. In the Antonowicz experiments, a quartz plate with one aluminum electrode was covered with polyfurfuryl alcohol solution and the plate was heated. Once carbonization was accomplished, an upper aluminum electrode was deposited by evaporation to form a sandwich. The samples exhibited switching behavior, but remained switched for long periods of time, for example, one to three days. The experimental samples were apparently made as a part of a study of fundamental physical properties of carbon, and the article does not teach the use of the samples as electronic devices. Antonowicz et al conclude that the samples are "very difficult" to prepare with a "sufficient degree of reproducibility for basic research."

It is a basic object of the present invention to provide a non-ohmic fiber element useful in the fabrication of electronic devices.

It is another object of the present invention to provide useful electronic devices made from partially pyrolyzed polymer fibers, and to provide methods of making such devices. These devices include: electronic switches, responsive to electrical stimulae; bipolar, high current switches and varistors; and environmentally responsive switches such as thermal switches; and memory elements switchable between a high and a low resistance state.

These and other objects and features will be apparent from the following description and claims, when read with the accompanying drawings.

SUMMARY OF THE INVENTION

Applicants have investigated the voltage-current characteristics of partially pyrolyzed polymer elements at various voltage levels and current densities and discovered useful non-ohmic properties which depend on the preparation of the polymer elements, use environments and electrical biasing conditions.

As used herein the term "pyrolysis" generally means chemical decomposition of a material by heat. The term "partial pyrolysis" signifies that the decomposition of the starting polymer is not carried out to completion (i.e., it does not produce a substantially all-carbon material), but is terminated at a point where the material still contains a substantial percentage of the original non-carbon constituents, such as hydrogen, nitrogen, oxygen, and possibly other elements. Pyrolyzation is normally performed in a non-oxidizing atmosphere.

In one embodiment of the present invention an electrical switch is provided including a piece of partially pyrolyzed polymer material, pyrolyzed at a temperature between 500° C. and 800° C. so that it exhibits negative resistance in a portion of a voltage current domain. Such a piece of partially pyrolyzed polymeric material may have a small signal average resistivity greater than about 1 ohm-cm. Means are provided for applying an electrical field to the polymeric material to cause the material to exhibit negative resistance.

Advantageously, the device may be fabricated from a piece of partially pyrolyzed filament having an average cross-sectional area on the order of $10^{-6} cm^2$. Electrodes may be located at two locations spaced along the length of the filament to define an electrically active portion of the filament less than one millimeter in length. The foregoing size constraints permit the imposition of the appropriate voltage gradients and current densities to induce switching behavior in the device.

The present invention also relates to a method of making electrical devices such as a bi-directional switches, varistors and thermal switches. The method calls for stabilizing a polymer filament in a controlled atmosphere while heating the filament. The filament may then be pyrolyzed by further heating it to higher temperatures, between 500° C. and 800° C. Electrodes may be applied to the filament at two different locations along the length of the filament to define an electrically active portion of the filament. The filament may then be encapsulated. In preferred embodiments of the present invention the polymer filament includes a polymer selected from the group of homopolymers and copolymers or polyacrylonitrile, aromatic polyamide polymer and polybenzimidazole polymer.

Electrically active elements made according to the methods described herein may exhibit negative resistance characteristics at bias voltages above a threshold or breakover voltage $V_{BO}$ for the device at an ambient temperature. Such devices typically have a threshold voltage gradient greater than 800 volts per centimeter of filament length at room temperature. The filaments may be selected to have an average cross-sectional area on the order of $10^{-6} cm^2$ and the average current density at the voltage $V_{BO}$ is typically greater than 100 amperes per square centimeter at room temperature. Some devices produced have long switching recovery time, and thus may act as an electrical memory.

Advantageously, plural polymer filaments may be composited by orienting the filaments substantially in parallel and embedding them in an essentially non-conductive material. Devices fabricated in this fashion can provide higher current carrying capability than single filament devices.

BRIEF DESCRIPTION OF THE DRAWINGS

FIG. 1 is a plan view of an electrical device employing a partially pyrolyzed polymer filament as its active element.

FIG. 2 is a schematic diagram of a circuit for testing the electrical properties of a device such as that shown in FIG. 1.

FIG. 3 is a generalized voltage-current plot (V-I curve) for a bipolar electrical device having partially pyrolyzed polymer as its active element.

FIG. 4 is a voltage-current plot for a device designated CP-677, exhibiting switching behavior.

FIGS. 6a and 6b are pictorial views of two multi-filaments, composite electrical devices.

FIG. 8 is a plot of current and voltages as a function of ambient temperature for a device designated PBI-700.

DETAILED DESCRIPTION

Figure 5:
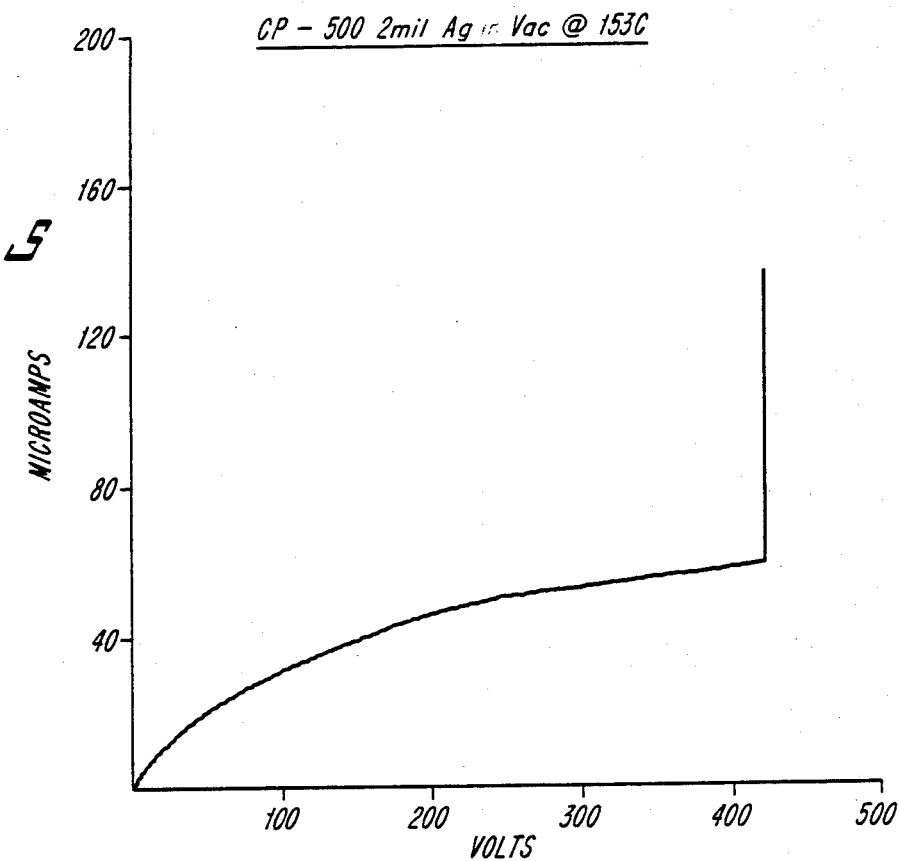
FIG. 5 is a voltage-current plot for a device designated CP-500.

Applicants have discovered certain useful, non-ohmic voltage-current characteristics which may be produced in partially pyrolyzed polymer materials, especially short segments of partially pyrolyzed polymer filament.

Electrical devices, made from fiber processed under selected conditions and used under selected bias and environmental conditions, exhibit switching behavior. This switching behavior embraces abrupt changes in device resistance in response to applied voltage and negative resistance in a portion of the voltage-current domain for the device.

Switching behavior has been observed in partially pyrolyzed samples made from the polymeric precursor materials as described below.

Acrylic fibrous material may serve as a precursor material. Such materials may be prepared by conventional techniques well known to those skilled in the art and may be either an acrylonitrile homopolymer or an acrylonitrile copolymer which contains at least 85 mole percent of acrylonitrile and up to 15 mole percent of one ore more monovinyl units copolymerized therewith.

One example of acrylic material employed in Celiox TM brand fibers, manufactured for Celanese Corporation. These fibers are formed by thermal stabilzation of a continuous filament acrylonitrile coplymer yarn comprising approximately 98 mole percent of recurrent acrylonitrile units and approximately 2 mole percent of recurring methyl acrylate units.

An example of a suitable acrylic homopolymer is Dralon TM brand fibers, a commercial polyacrylonitrile homopolymer filber manufactured by Farbenfabrik Bayer, Leverkusen, West Germany.

Wholly aromatic polyamides may also serve as precursor material.

Specific examples of wholly aromatic polyamides include polyparabenzamide and polyparaphenyleneterephthalamide. Polyparabenzamide and processes of preparing the same are disclosed in U.S. Pat. Nos. 3,109,836; 3,225,011; 3,541,056; 3,542,719; 3,547,895; 3,558,571; 3,575,933; 3,600,350; 3,671,542; 3,699,085; 3,753,957; and 4,025,494. Polyparaphenyleneterephthalamide, which is available commercially under the trademark Kevlar ®, and processes of preparing the same are disclosed in U.S. Pat. Nos. 3,006,899; 3,063,966; 3,094,511; 3,232,910; 3,414,645; 3,673,143; 3,748,299; 3,836,498; and 3,827,998, among others. All of the above-cited U.S. patents are herein incorporated by reference in their entirety. Other wholly aromatic polyamides are poly[2,7-(phenanthridone)terephthalamide], poly(paraphenylene-2,6-naphthalamide), poly[(methyl-1,4-phenylene)terephthalamide), and poly[(chloro-1,4-phenylene)terephthalamide]. Additional specific examples of wholly aromatic polyamides are disclosed by P. W. Morgan in *Macromolecules*, Vol. 10, No. 6, pp. 1381-90 (1977), which is herein incorporated by reference in its entirety.

Polybenzimidazoles may also serve as precursor material.

Polybenzimidazoles are a know class of heterocyclic polymers which consist essentially of recurring units of the following formulas I and II. Formula I is:

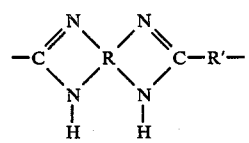

wherein R is a tetravalent aromatic nucleus, with the nitrogen atoms forming the benzimidazole rings being paired upon adjacent carbon atoms, i.e., ortho carbon atoms, of the aromatic nucleus, and R' is a member of the class consisting of an aliphatic (alkylene) group, a cycloaliphatic ring, an aromatic ring and a heterocyclic ring such as pyridine, pyrazine, furan, quinoline, thiophene, and pyran.

Formula II is:

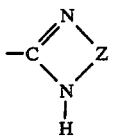

wherein Z is an aromatic nucleus having the nitrogen atoms forming the benzimidazole ring paired upon adjacent carbon atoms of the aromatic nucleus.

Preferably, the continuous filamentary materials are prepared from aromatic polybenzimidazoles, that is, from polymers consisting essentially of the recurring units of Formula II and of Formula I wherein R' is an aromatic ring or a heterocyclic ring.

As set forth in the U.S. Pat. No. 3,174,947 and Reissue Pat. No. 26,065, which are incorporated herein by reference, the aromatic polybenzimidazoles having the recurring units of Formula II may be prepared by self-condensing a trifunctional aromatic compound containing only a single set of ortho disposed diamino substituents and an aromatic, preferably phenyl, carboxylate ester substituent. Exemplary of polymers of this type is poly-2,5(6)-benzimidazole prepared by the auto-condensation of phenyl-3,4-diaminobenzoate.

As also set forth in the above-mentioned patents, the aromatic polybenzimidazoles having the recurring units of Formula I may be prepared by condensing an aromatic tetraamine compound containing a pair of orthodiamino substituents on the aromatic nucleus with a dicarboxyl compound selected from the class consisting of (a) the diphenyl ester of an aromatic dicarboxylic acid, (b) the diphenyl ester of a heterocyclic dicarboxylic acid wherein the carboxyl groups are substituents upon carbon in a ring compound selected from the class consisting of pyridine, pyrazine, furan, quinoline, thiophene and pyran and (c) an anhydride of an aromatic dicarboxylic acid.

Examples of aromatic polybenzimidazoles which have the recurring structure of Formula I and which may be formed into fibers or yarns include: poly-2,2'-(m-phenylene)-5,5'-bibenzimidazole; poly-2,2'-(pyridylene-3'',5'')-5,5'-bibenzimidazole; poly-2,2'-(furylene-2'',5'')-5,5'-bibenzimidazole; poly-2,2'-(naphthalene-1'',6'')-5,5'-bibenzimidazole; poly-2,2'-(biphenylene-4'',4''')-5,5'-bibenzimidazole; poly-2,2'-amylene-5,5'-bibenzimidazole; poly-2,2'-octamethylene-5,5'-bibenzimidazole; poly-2,6-(m-phenylene)-dimidazobenzene; poly-2,2'-cyclohexenyl-5,5'-bibenzimidazole; poly-2,2'-(m-phenylene)-5,5'-di(benzimidazole) ether; poly-2,2'-(m-phenylene)-5,5'-di(benzimidazole) sulfide; poly-2,2'-(m-phenylene)-5,5'-di(benzimidazole) sulfone; poly-2,2'-(m-phenylene)-5,5'-di(benzimidazole) methane; poly-2',2''-(m-phenylene)-5',5''-di(benzimidazole) propane-2,2; and poly-2',2''-(m-phenylene)-5',5''-di(benzimidazole) ethylene-1,2 where the double bonds of the ethylene groups are intact in the final polymer.

The preferred aromatic polybenzimidazole fiber or yarn is one prepared from poly-2,2'-(m-phenylene)-5,5'-bibenzimidazole, the recurring unit of which is:

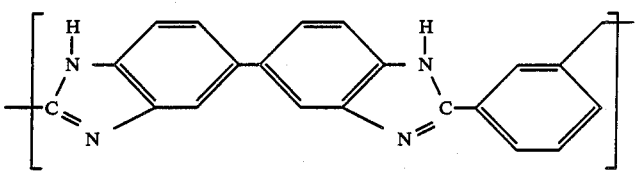

Any polymerization process known to those skilled in the art may be employed to prepare the polybenzimidazole which may then be formed into a continuous filamentary material and subjected to the drying treatment of the present invention. Preferred techniques used to prepare the polybenzimidazole are disclosed in U.S. Pat. Nos. 3,509,108 and 3,551,389, both herein incorporated by reference.

These exemplary precursor materials have a number of characteristics in common. They have an electrical resistivity of greater than $10^{10}$ ohm-cm. They may be partially pyrolyzed at temperatures between 500° C. and 800° C. to produce material having an average small signal resistivity of from about one to $10^6$ ohm-cm at 25° C., measured at a current of less than 10 microamperes. Useful devices typically have an average small signal resistivity from 1 to 100 ohm-cm. at 25° C. When pyrolyzed the materials generally retain their original macroscopic configuration, e.g., the fibers retain the same general physical dimensions of the precursor. The materials do not form a skin or core of radically different composition when subjected to stabilization and pyrolysis.

Generally, the materials, with the novel electrical properties discussed below, are made by first stabilizing a yarn made from the fibers in a controlled atmosphere at temperatures less than 500° C. Typically, this stabilization step is preoxidation performed in air or an oxygen enriched atmosphere, although an electrical switch has been fabricated from a polyparaphenyleneterephtalamide fiber sample stablized in a substantially pure nitrogen atmosphere. The materials are then pyrolyzed in an atmosphere essentially free of oxygen and moisture at temperatures of from 500° C. to 800° C. in a furnace. The yarn is cooled to room temperature in the controlled atmosphere.

Individual filaments may be mounted for electrical testing as shown in FIG. 1. An assembled electrical device is denoted generally by the numeral 20. The device may consist of a single pyrolyzed filament 22 placed on a ceramic substrate 24. Metallic electrodes 26 may be evaporated onto the filament and substrate leaving exposed an active portion of the filament of length L. Electrical leads 28 may then be attached to the evaporated electrodes. Single filament electrical switches have been fabricated with active portions (L) varying from about 2 to 30 mils in length although an electrical switch has been made of a composite of fibers, each about 100 mils in length. The small size of the active element may be of benefit in miniturizing circuitry employing the fibers. The resulting structure is a bi-directional electrical device, whose electrical properties may be measured employing the test apparatus shown schematically in FIG. 2.

The test apparatus of FIG. 2 includes a function generator 40 for applying a level biasing voltage, sine wave or, single or multiple pulses (square wave or ramp voltages) to the electrical device 20' under test. A limiting resistor $R_L$ may be placed in circuit with the device 20' and function generator 40, to prevent overload of the device 20' when it switches to a more highly conductive state. Current flowing through the device 20' also flows through a current sense resistor $R_I$. A current sensor 42 may be connected in parallel with $R_I$. Likewise a voltage sensor 44 may be connected in parallel with the device 20' as shown in the Figure.

In preferred embodiments, a ramp voltage of selected duration and amplitude is applied to the device through $R_L$ and $R_I$. Current and voltage measurements are combined in a electronic curve tracer to provide a V-I curve for the device under test.

FIG. 3 is a generalized V-I curve for an electronic switch made according to the teachings of the present invention from a segment of a partially pyrolyzed polymer fiber. The device shows a non-ohmic positive resistance in sector A of FIG. 3. The bias voltage on the device may be raised until a breakover voltage $V_{BO}$ is reached, the current passing through the device at this voltage being denominated $I_{BO}$. The curve in the vicinity of the $V_{BO}$ is sometimes referred to as the "knee" of the V-I curve. For currents above the breakover current $I_{BO}$, the device exhibits negative resistance which is indicated by the abrupt snap-back in segment B of the V-I curve. The tangent of the V-I curve at zero volts is a measure of the small signal resistance of the device.

By way of illustration and not by limitation, the following examples are presented relating to electrical devices fabricated in accordance with the teachings of the present invention.

EXAMPLE I

CP-677

A heat stabilized CELIOX polyacrylonitrile filament yarn, grade CP-1000, containing about 1000 filaments was placed in a ceramic split tube furnace with both ends of the yarn protruding from the furnace. The heat stabilized yarn previously had been formed by heating the acrylic fibrous material in an air atmosphere at a temperature below 300° C. until it was black in appearance, non-burning when subjected to an ordinary match flame, and possessed a bound oxygen content of at least 7 percent by weight when subjected to the Unterzaucher elemental chemical analyses. In order to avoid excessive catenary and maintain polymer orientation each end of the yarn was guided over a pulley and provided with a 30 gram weight so as to keep the yarn under tension at all times. The furnace used for the pyrolysis was made by the Mellen Co., (Model 2-321-4) and included the necessary temperature and power supply control units to provide a controlled, uniform temperature heat zone (flat zone), about 12-15 inches long, in the center of the furnace. A flow of nitrogen of purity greater than 99% facilitated exclusion of air and moisture from the flat zone. The furnace was then heated to 677° C.±3° C. in the central zone in about 15 minutes and held at that temperature for 30 minutes, whereupon the power was shut off and the yarn allowed to cool to near room temperature. After removal of the yarn from the furnace, a 4-5 inch center section was cut out of the yarn and used as a source of filament.

A single filament was removed from a yarn, the filament being about 8 micrometers (microns) in diameter with a linear density of about 1.1 denier. The filament was cut to a length of about ½ inch and mounted on a ceramic substrate about one inch square and 0.030 inches thick for electrical evaluation. The filament was first attached to the substrate by painting on a strip of flexible silver paste (silver paste #13 made by Engelhard Industries, Inc.) The paste was then air cured in an oven at 100° C. for 30 minutes. This procedure immobilized the filament on the substrate. Next, the substrate was pressure fitted into a matching mask. The mask, made of aluminum sheet metal and copper wire, was constructed so as to permit evaporation of a metal coating over most of the filament, except for a masked-off central section of variable, controllable length between 25-125 microns. After evaporation the masked region constitutes the electrically active portion of the electrical device. The substrate-mask assembly was then placed in a Vacuum Coater (Edwards Ltd., Model E306 A) which was then used in a standard fashion to evaporate a conductive silver layer, over the outer portion of the sample filament at a rate which deposited a layer about 1 micron thick in 45 minutes. The width of the uncoated central section ("gap") was about 75 microns (approximately 3 mils). After the substrate was withdrawn from the coater and the mask removed, copper connecting wires about 125 microns in diameter were attached to each side of the uncoated filament section by means of the above-described silver paste, applied over the evaporated silver coating. The silver paste was then air cured in an oven.

For evaluation of the voltage-current characteristics, the device was connected in series with a function generator and a non-inductive metal film limiting resistor. The instantaneous current and voltage values were measured across the limit resistor (100 K ohm, 1%) and the sample filament, respectively, using the differential amplifiers of a digital oscilloscope (Nicolet Instrument Co., model 2090-III) which digitized the reading to provide 1024 data points on each channel and stored them on a soft disc for display, as needed. The power was applied as a single, linearly increasing ("ramp") voltage pulse, originating from the sweep generator of a Tektronix, model 5112, oscilloscope and amplified by a suitable power amplifier. The pulse width was 18 milliseconds, and the maximum voltage output was adjusted manually upward until the V-I curve become highly non-linear.

The electrical measurements were performed at room temperature in a dry nitrogen atmosphere. Initially, the small signal filament resistance was 358 K ohmns. The V-I curve obtained for the device is shown in FIG. 4. It is seen to consist of an approximately linear portion A' followed by a sudden increase in current to a point at which the voltage across the sample reaches a limiting value ("knee" voltage) and drops rapidly thereafter with the current increasing until limited by the 100 K ohm resistor. In this case the "knee" or breakover voltage was about 12.0 volts and the current of 99.5 microamperes. This corresponds to an effective resistance of about 120 K ohms at the knee that decreased rapidly with increasing current to a value as low as 6.5 K ohms at 1.74 milliamperes and 7.0 volts, i.e. a resistance ratio of about 55 between the initial and the final states.

EXAMPLE II

CP-500

A second sample of stabilized CELIOX polyacrylonitrile filament yarn, grade CP-1000, was heat treated in the Mellen furnace as described in Example I, except that the heat treatment temperature was 500° C.±3° C. and the heat up time to that temperature was 45 minutes. A single filament from this yarn was mounted on the ceramic substrate, and a contact layer of silver evaporated in the same manner as described above, except that the uncoated gap width was about 50 microns. The filament diameter and denier were virtually the same as in Example I.

Using the aforementioned electrical test apparatus, it was observed that the V-I curve was practically linear when the measurement was carried out at or near room temperature in nitrogen or vacuum. The low voltage d.c. resistance of the non-metallized filament section was about $24.8 \times 10^8$ ohms. The device was then enclosed in nitrogen filled air-tight stainless steel vessel which was then progressively heated to about 150° C. by means or an external heating tape. When the vessel temperature reached 135° C., a very high degree of non-linearity occurred. At that point the "critical" voltage was about 541 volts and the corresponding current was about 98 microamperes. The low current d.c. resistance at 135° C. was about $2.8 \times 10^8$ ohms. The critical voltage was observed to decrease with increasing temperature and was 423 volts at the maximum measured temperature of 153° C. in a partial vacuum. As shown in FIG. 5, beyond the critical voltage, the V-I curve shows an extremely steep climb, indicating the utility of such a material for voltage limiting devices. In subsequent tests the V-I behavior of the CP-500 was studied further at a range of temperatures between 75° and 180° C. at pressures of about $10^{-6}$ to $10^{-7}$ Torr. When this was done the device exhibited negative resistance similar to that observed for acrylic fiber samples pyrolyzed at higher temperatures.

EXAMPLE III

CP-721

A third sample of stabilized CELIOX polyacrylonitrile filament yarn, grade CP-1000, was pyrolyzed as described in Example I except that the heat treatment temperature was about 721° C. Approximately 1000 filaments from the yarn were mounted and contacted as shown in FIG. 6a. The filaments 50 were aligned so that they were approximately parallel. Silver paste 52 was then applied to connect the filaments to electrical leads 54 and to define active portions of the filaments of about 2.5 millimeters in length (L).

Using the aforementioned electrical test apparatus it was observed that the device exhibited a switching breakover voltage, $V_{BO}$, of about 66 volts at room temperature. However, the current and the switching knee ($I_{BO}$) was much larger than the current observed at the switching knee for single filament devices. The current $I_{BO}$ was about 80 milliamps, or about three orders of magnitude greater than the current $I_{BO}$ observed for the single filament sample of Example I.

The results of Example III indicate that high current devices could be constructed from multi-filament composites. Such a composite could take the form shown in FIG. 6b. The device of FIG. 6b could be manufactured by potting parallel filaments 56 in a non-conductive resin 58. The potted filament could then be lapped to the desired thickness L. Electrodes 60, could then be applied to the faces of the device to provide electrical connection to leads 62.

EXAMPLE IV

CP-800

A stabilized Celiox polyacrylonitrile filament yarn, grade CP-1000, was pyrolyzed in the same general manner as described in Example I except that the heat treatment temperature was about 800° C. A single filament from this yarn was mounted on a ceramic substrate, and a contact layer of silver evaporated in the same manner as described above. The uncoated gap width L was about 50 microns.

Electrical switching behavior could not be observed in the sample at room temperature. However, when the device was cooled to $-195°$ C., a switching knee was observed where $V_{BO}$ was about 4.4 volts and $I_{BO}$ was about 441 microamps.

The small signal resistance of the sample at $-195°$ C. was about 17.5 K ohms. This is the lowest small signal resistance thus far observed in a pyrolyzed filament device which exhibits switching behavior. In contrast the small signal resistance of this device at room temperature was about 3 K ohms.

The cross-sectional area of the filament was on the order of $10^{-6}$ cm$^2$, and as noted above, the filament length was about 50 microns. Therefore the average resistivity of the device was about 3.5 ohm-cm at minus 195° C.

Samples of acrylonitrile, wholly aromatic polyamide and polybenzimidazole fibers pyrolyzed at about 600° C., with active lengths between 0.4 and 0.7 millimeters, had relatively high small signal resistances: from about $10^7$ to $10^{12}$ ohms. In a number of such devices, no switching behavior was observed.

At the other end of the scale, samples of acrylonitrile, wholly aromatic polyamides and polybenzimidazole fibers, pyrolyzed at about 800° C. with active length between 0.4 and 0.7 millimeters, had relatively low, small single resistances of about $10^4$ ohms. None of these devices exhibited switching behavior at room temperature. However, as noted above, the device of Example IV, when cooled to minus 195° C., did exhibit switching behavior.

This data indicates limitations on the pyrolysis temperatures used in fabricating devices for use at low voltages and in environments near room temperature.

Additional experiments have shown that the switching properties of partially pyrolyzed polymer fibers, configured and biased as bipolar electrical devices, are dependent on ambient temperature. This dependancy indicates that the devices may be useful as thermal switches. Examples V and VI, below, relate to the use of partially pyrolyzed polymer filaments as temperature detectors.

EXAMPLE V

DRA - 675

A sample of Dralon polyacrylonitrile filament yarn (denier 2.0 dpf), that was stabilized at 220° to 270° C. for 4 hours in flowing a air stream, was heated to 675° C. in pure nitrogen flow in 20 minutes and held at 675° $\pm 3°$ for 30 minutes. After cooling to room temperature a single filament was extracted and mounted on a ceramic substrate with the silver paste described above, defining an active portion of the filament about 25 mils in length. The mounted sample was then given a final heat treatment at about 675° C.

Using the aforementioned apparatus, electrical tests were performed on the device in nitrogen. The low voltage d.c. resistance of the device was about 2 megaohms at room temperature.

V-I curve traces were made for the device at each of four temperatures: 24.8° C., 50.4° C., 75.7° C., and 99.5°

Figure 7:
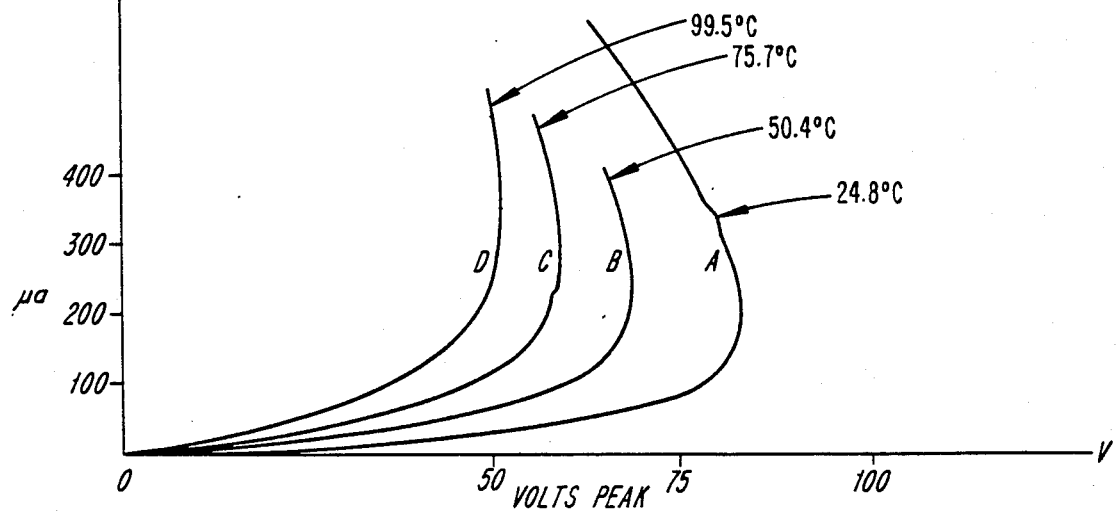
FIG. 7 is a series of voltage current plots for a device designated DRA-675, at four different ambient temperatures.

C. A 100 K ohm limiting resistor and 25 millisecond ramp voltage pulse were employed. These V-I curves are superimposed in the graph of FIG. 7. The figure shows a gradual decrease in the value of $V_{BO}$ with an increase in temperature.

EXAMPLE VI

PBI - 700

A sample of poly-2,2'-(m-phenylene)-5,5'-bibenzimidazole yarn (average denier 1.5 dpf) was heat stabilized in a circulating air oven by heating the oven, containing the yarn, rapidly to 450° C.±10° C. in 13 minutes and holding it at that temperature for 8 minutes and it cooling quickly. A portion of the sample was then pyrolyzed at a maximum temperature of 700°±3° C. for 30 minutes, in the same general manner as the sample of Example I.

Electrical tests were performed on the resulting device using the aforementioned apparatus. The low voltage d.c. resistance of the device was about 7 megaohms at room temperature.

A d.c. bias was applied across the series combination of the device, $R_L$ and $R_I$ and the temperature of the device gradually raised by means of the apparatus described in connection with Example II. The results of these tests are shown graphically in FIG. 8. As shown in the Figure, at about 58.5° C. the device shifted from a low conductive state to a highly conductive state. At the same time, the voltage across the device dropped from about 101.9 volts to about 58.9 volts. The results indicate the utility of the device as a thermal switch.

As shown in FIG. 8 the current through the device increased from about 100 microamps to about 500 microamps in less than 0.25 sec., while the temperature was changing at about 6° C. per minute. This corresponds to a temperature change of less than 0.02° C. triggering about a five-fold current increase.

The temperature at which the switching occurs could be set by selection of the appropriate biasing voltage for the partially pyrolyzed polymer element. In addition the temperature at which switching occurs can be varied over a wide range by modifying the filament preparation and geometry as indicated by the examples disclosed here.

It is expected that the use of voltage pulses instead of d.c. operation, as in the example, would provide greater stability and reproducibility. Short duty cycle square wave pulses would reduce undesired heating of the device and provide time for the active element to return to ambient temperature and recover from the switching. In addition the device could be interrogated with pulses of varying voltage so that the device could operate as a temperature sensor over a range of temperatures, rather than as a threshold temperature switch at a single bias voltage.

EXAMPLE VII

KEV - 700

Kevlar polyamide filament yarn (denier 1.4 dpf.) was heat stabilized in an air atmosphere, as described in the previous Example VI. A sample was then pyrolyzed in the same general manner as described in Example I except that the heat treatment temperature was about 700° C. A single filament was mounted on a ceramic substrate and silver contacts were painted on the filament and substrate to define an active portion of the filament about 0.6 millimeters in length.

The device was tested with a ramp voltage at room temperature, first in nitrogen, then in a vacuum. In nitrogen the breakover voltage, $V_{BO}$, was about 27.9 volts and the current at that voltage, $I_{BO}$, about 700 microamps. In vacuum, the breakover voltage was about 13.6 volts and the breakover current about 314 microamps.

The small signal resistance of the device was measured to be about 0.196 megaohms in nitrogen at room temperature and 0.142 megaohms in a vacuum at room temperature. Given an approximate average cross-sectional area of $10^{-6} cm^2$ for the filament, the average resistivities of the filament are about 3.3 ohm-cm and 2.4 ohm-cm in nitrogen and in a vacuum, respectively.

These tests and similar tests performed with CP-500 and PBI-700 indicate that the electrical properties of partially pyrolyzed polymer filament devices are sensitive to the medium in which they are operated. To stabilize device parameters and obtain more predictable results from such devices as conventional electrical components the filaments may be encapsulated in a controlled media in the same way that conventional transistors and diodes are encapsulated.

The foregoing examples indicate the suitability of a number of partially pyrolyzed polymeric materials for use as electrical devices. The temperatures of pyrolyzation are determinative of the electrical parameters of the devices. More specifically, lower pyrolyzation temperatures result in electrical devices more suitable for use as varistors. Such devices tend to have relatively high, small signal rsistivity and decreasing resistance (typically exponentially decreasing) resistance at some higher bias voltage. Higher pyrolysis temperatures tend to yield devices suitable for use as low voltage, bi-directional switches. Some devices tend to have relatively lower, small signal resistivity, and exhibit negative resistance in a portion of their voltage-current domain above a breakover voltage and current, $V_{BO}$ and $I_{BO}$.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

We claim:
1. A method of making an electrical apparatus, comprising the steps of:
   stabilizing a polymer filament in an atmosphere containing oxygen;
   partially pyrolizing the filament by heating the filament to between 500° and 800° C.;
   applying electrodes to the filament at two different locations along the length of the filament;
   connecting to said electrodes a source of an electrical signal; and
   selectively applying an electrical signal to said electrodes causes the filament to exhibit negative resistance.
2. The method of claim 1, wherein the polymer filament includes a polymer selected from the group consisting of an acrylic, a wholly aromatic polyamide, and a polybenzimidazole.
3. The method of claim 1, wherein the electrically active portion of the filament defined by application of the electrodes is less than 30 mils in length.

4. The method of claim 1, wherein the polymer filament has a cross-sectional area on the order of $10^{-6}$ cm$^2$.

5. The method of claim 1, wherein the selectively applied electrical signal which causes the filament to exhibit negative resistances causes a voltage gradient between said electrodes of greater than 800 volts per centimeter.

6. The method of claim 1, wherein negative resistance occurs when the selectively applied electrical signal exceeds a threshold voltage $V_{BO}$ for the filament, wherein the average cross-sectional area A of the filament is on the order of $10^{-6}$ cm$^2$ and wherein the current density selectively applied to the electrodes at the threshold voltage $V_{BO}$ is greater than 100 amps per square centimeter at room temperature.

7. The method of claim 1, wherein the filament after the step of partially pyrolyzing the filament, has a small signal resistivity between about 1 ohm-cm and $10^6$ ohm-cm.

8. A method of making an electrical switch, comprising the steps of:

stabilizing a polymer filament in an atmosphere containing oxygen;

partially pyrolyzing the filament by heating the filament to between 500° C. and 800° C.; and applying to the filament at two different locations along the length of the filament a voltage gradient greater than 800 volts per centimeter thereby causing the filament to exhibit negative resistance.

9. A method of making an electrical apparatus, comprising the steps of:

stabilizing in an atmosphere containing oxygen a filament made from a polymer selected from the group consisting of an acrylic, a wholly aromatic polyamide, and a polybenzimidazole;

partially pyrolyzing the filament by heating the filament to between 500° C. and 800° C. so that it exhibits a small signal resistivity between 1 ohm-cm and $10^6$ ohm-cm; and applying to the partially pyrolyzed filament at two different locations along the length of the filament an electrical signal of sufficient magnitude to cause the filament to exhibit negative resistance.

* * * * *